(12) United States Patent
Tsuda

(10) Patent No.: US 7,719,366 B2
(45) Date of Patent: May 18, 2010

(54) PLL CIRCUIT

(75) Inventor: Shinichiro Tsuda, Kanagawa (JP)

(73) Assignee: Sony Corporation, Tokyo (JP)

(*) Notice: Subject to any disclaimer, the term of this patent is extended or adjusted under 35 U.S.C. 154(b) by 57 days.

(21) Appl. No.: 12/235,645

(22) Filed: Sep. 23, 2008

(65) Prior Publication Data
US 2009/0079508 A1 Mar. 26, 2009

(30) Foreign Application Priority Data
Sep. 26, 2007 (JP) .......................... P2007-250208

(51) Int. Cl.
*H03L 7/08* (2006.01)
*H03L 7/085* (2006.01)
(52) U.S. Cl. .................... 331/17; 331/1 A; 331/16; 331/25; 327/156; 375/376; 455/260
(58) Field of Classification Search ................ 331/1 A, 331/16–18, 25; 327/156–159; 375/376; 455/260
See application file for complete search history.

(56) References Cited
U.S. PATENT DOCUMENTS
6,851,492 B2 2/2005 Sato 7,292,662 B2 * 11/2007 Gregorius .................. 375/350

FOREIGN PATENT DOCUMENTS
JP 8-148994 6/1996

OTHER PUBLICATIONS
R. Staszewski et al., "All-Digital Phase-Domain TX Frequency Synthesizer for Bluetooth Radios in 0.13μm CMOS", ISSCC2004 Digest, 2004, 0-7803-8267-6/04 IEEE, 10 pages.
R. Staszewski, "Frequency Synthesizers in Nanometer CMOS" ISSCC Short Course, 2007, p. 1-120.

* cited by examiner

*Primary Examiner*—David Mis
(74) *Attorney, Agent, or Firm*—Finnegan, Henderson, Farabow, Garrett & Dunner, L.L.P.

(57) ABSTRACT

Disclosed herein is a phase lock loop (PLL) circuit capable of executing digital control of an oscillation circuit thereof by using a dividing ratio represented by a digital value obtained by dividing an oscillation frequency by a reference frequency. The PLL circuit includes a phase comparator for comparing the digital value obtained by converting the dividing ratio with a digital value representing each cumulative addition value of a clock count expressed in a decimal-point format representing the oscillation signal in each period of a reference signal, a loop-gain control section configured to control the loop gain of the PLL circuit, and an output converging section configured to converge an output by the phase comparator.

8 Claims, 5 Drawing Sheets

PLL CIRCUIT

CROSS REFERENCES TO RELATED APPLICATIONS

The present invention contains subject matter related Japanese Patent Application JP 2007-250208 filed in the Japan Patent Office on Sep. 26, 2007, the entire contents of which being incorporated herein by reference.

BACKGROUND OF THE INVENTION

1. Field of the Invention

The present invention relates to a PLL (Phase Lock Loop) circuit for locking a carrier frequency at an accurate frequency. More particularly, the present invention relates to a PLL circuit configured to execute digital control on a DCO (Digitally Controlled Oscillator).

To put it in detail, the present invention relates to a PLL circuit for stabilizing a loop thereof without substantially increasing the number of bits of output by a phase comparator employed therein. In particular, the present invention relates to a PLL circuit for reducing a loop error and improving responsiveness of convergence by properly controlling the gain of the loop.

2. Description of the Related Art

In order to lock a carrier frequency at an accurate frequency in a radio communication terminal, the radio communication terminal is provided with a PLL (Phase Lock Loop) circuit. In the data-communication and satellite-communication fields, a large number of digital PLL circuits are used and serve as a subject of aggressive research. Such a digital PLL circuit includes a phase comparator having a digital configuration, a low-pass filter and a VCO (Voltage-Controlled Oscillator).

A typical digital PLL circuit includes the digital phase comparator, the low-pass filter and the voltage-controlled oscillator, which are connected to each other to form a loop. The digital phase comparator carries out an operation for comparing the phase of a reference signal with the phase of a signal outputted by the voltage-controlled oscillator, generating a voltage according to the difference in phase between the signals so as to reduce the phase difference, and changing the oscillation frequency of the signal outputted by the voltage-controlled oscillator. An in-synchronization state is defined as a state in which the phase difference detected by the digital phase comparator is zero or a close to zero. A lead-in state is defined as a state of transition from an out-of-synchronization state to an in-synchronization state. For more information, refer to Japanese Patent Laid-open No. Hei 8-148994 (Paragraph 0002, FIG. 14). It is to be noted that the low-pass filter is not only for removing components each having a high frequency from the signal outputted by the phase comparator in order to produce a smoothed direct current signal, but also for determining the synchronization and response characteristics of the PLL circuit. In addition, the low-pass filter also determines the loop gain in accordance with setting such as a cutoff frequency. Thus, the low-pass filter is an important component for the stability of the synchronized-phase state and for the time which is required to lead-in.

Most existing digital PLL circuits are each implemented as a hybrid PLL IC (integrated circuit), in which all PLL-circuit components except the voltage-controlled oscillator is integrated with digital circuits, that is, a digital circuit and an analog circuit coexist therein. The phase comparator here is a digital phase comparator consists of logic circuits. The phase comparator outputs a signal in one of three states by adoption of a charge-pump technique. Since the phase comparator consumes a voltage $V_{DS}$ between the drain and source in order to operate the comparator linearly; therefore the digital phase comparator is improper for a circuit system driven by a low voltage.

With semiconductor-process miniaturization going on in recent years, a PLL circuit having a full digital configuration has been attracting attention. In such circuit, a VCO controlled by an analog voltage is replaced with a DCO (Digitally Controlled Oscillator). FIG. 7 is a diagram showing a typical configuration of an all-digital PLL circuit employing a DCO. In the figure, a TDC (Time-to-Digital Converter) circuit converts a time difference corresponding to the fractional part of a dividing ratio into a digital value while an accumulator circuit converts the integer part into a digital value. The digital values corresponding to the dividing ratio thus detected are fed-back by a variety of techniques in order to digitally control. For more information, refer to R. B. Staszewski et al., All-Digital Phase-Domain TX Frequency Synthesizer for Bluetooth Radios in 0.13 µm CMOS (ISSCC 2004 Digest).

In the phase comparison process carried out by the digital PLL circuit of this type, in each period of a reference signal, it is performed a subtraction process of finding a difference between a digital value obtained by converting the dividing ratio and a digital value representing each cumulative addition value of a clock count expressed in a decimal-point format representing the oscillation frequency. For this reason, the variation range of the phase comparison process is limited by the number of bits. Thus, a phase comparison process carried out in a domain beyond the variation range becomes inaccurate, making the loop of the digital PLL circuit unstable. In addition, if the DCO is controlled by using a digital value representing a fractional dividing ratio obtained by dividing an oscillation frequency by a reference frequency, the loop gain will be equal to a ratio of a value output by the phase comparator to the fractional dividing ratio. Thus, in an attempt made to increase the loop gain in order to reduce an error generated in the closed loop, it is necessary to increase the number of bits expressing a value output by the phase comparator.

In addition, if the loop gain is set at a large value, the response time to a state of convergence becomes longer. Thus, in order to attain a state of convergence with a high degree of precision within a short time period required by each radio system, in a system making use of a negative feedback, the loop gain is generally switched from a value to another. To put it concretely, at an initial stage, the loop gain is set at a relatively small value but, as a process of convergence is carried forward thereafter, the loop gain is changed from the relatively small value to a larger value. In this case, however, there is raised a problem that, when the loop gain is changed from the relatively small value to the larger value, a discontinuity of the loop gain is generated, resulting in a delayed state of convergence. In order to solve this problem, there has been proposed a method for switching the loop gain as shown in a diagram of FIG. 8. For more information, refer to U.S. Pat. No. 6,851,492, and Chapter entitled "Frequency Synthesizers in Nanometer CMOS" of a text called ISSCC 2007 Short Course on Analog, Mixed-Signal and RF Circuit Design in Nanometer CMOS. In a configuration shown in the figure, however, even though assurance of the continuity of φE at a switching time is taken into consideration, the bit count output by an adder must be made greater than the bit count generated by a phase comparator in order to obtain a large loop gain.

SUMMARY OF THE INVENTION

It is desirable to provide a PLL circuit capable of executing excellent digital control in a configuration including a DCO.

It is further desirable to provide the PLL circuit with excellent digital control capable of stabilizing its loop without substantially increasing the number of bits output by a phase comparator employed therein.

It is still further desirable to provide the PLL circuit with excellent digital control capable of reducing a loop error and improving the responsiveness of convergence by properly controlling the loop gain thereof.

In order to solve the problems described above, one embodiment of the present invention provides a PLL circuit for executing digital control of an oscillation circuit by using a dividing ratio represented by a digital value obtained by dividing an oscillation frequency by a reference frequency. The PLL circuit includes: a phase comparator for comparing the digital value obtained by converting the dividing ratio with a digital value representing each cumulative addition value of a clock count expressed n a decimal-point format representing the oscillation signal of an oscillation signal in each period of a reference signal; a loop-gain control section configured to control the loop gain of the PLL circuit; and an output converging section for converging the output of the phase comparator.

Most of existing digital PLL circuits are each implemented as a hybrid type in which an analog circuit coexists with a digital circuit. In recent years, however, a PLL circuit having a full digital configuration has been attracting attention. In the full digital configuration, the VCO controlled by an analog voltage is replaced with a DCO.

In the phase comparison process carried out by the digital PLL circuit, in each period of the reference signal, it is performed a subtraction process of finding a difference between a digital value obtained by converting the dividing ratio and a digital value representing each cumulative addition value of a clock count expressed in a decimal-point format representing the oscillation frequency. For this reason, the variation range is limited by the number of bits. Thus, a phase comparison process in a domain beyond the variation range becomes inaccurate, unavoidably making the loop of the digital PLL circuit unstable. In addition, in an attempt made to increase the loop gain in order to reduce an error generated in the closed loop of the digital PLL circuit, it is necessary to increase the number of bits expressing a value output by the phase comparator, and the response time to the state of convergence inevitably becomes longer. In a system adopted by the digital PLL circuit as a system making use of a negative feedback, the loop gain is generally changed from a value to another. In this case, however, there is raised a problem that, when the loop gain is changed from a value to another, a discontinuity of the loop gain is generated, resulting in a delayed state of convergence.

The PLL circuit provided by the embodiment of the present invention, further employs: a DCO serving as an oscillation circuit which changes the oscillation frequency thereof in accordance with a digital signal applied thereto; a phase comparator for comparing a digital value obtained by converting the dividing ratio with a digital value representing each cumulative addition value of a clock count expressed in a decimal-point format representing the oscillation frequency in every period of the reference signal; and a first variable-gain circuit for amplifying an output by the phase comparator. In the configuration of this PLL circuit, after the output by the phase comparator is amplified, the oscillation circuit is controlled by using a digital value representing a dividing frequency ratio by dividing the oscillation frequency by a reference frequency. It is to be noted that, in order to express the clock count representing the oscillation frequency in a decimal-point format, the format needs to be created by using a TDC (Time-to-Digital Converter) for separately detecting a time difference smaller than 1 clock of the oscillation frequency.

In the phase comparison process carried out by the phase comparator, in each period of a reference signal, it is performed a subtraction process of finding a difference between a digital value obtained by converting the dividing ratio and a digital value representing each cumulative addition value of a clock count expressed in a decimal-point format representing the oscillation frequency. For this reason, the variation range of the phase comparison process is limited by the number of bits output by the phase comparator. Thus, in order to assure the stability of the loop, it is desired to actively converge the output by the phase comparator toward the vicinity of the center of the variation range.

In addition, by decreasing the gain of the first variable-gain circuit, it is possible to increase the gain of the open loop and, hence, reduce the difference in phase as well as decrease phase noises. However, the number of bits output by the phase comparator needs to be raised.

For the reasons described above, by providing the PLL circuit provided by the present invention with a mechanism for converging the output by the phase comparator to a desired target value, the PLL circuit can be made capable of reducing the number of bits output by the phase comparator while decreasing the difference in phase through an increased gain of the open loop. To put it concretely, as the loop-gain control section, the first variable-gain amplification circuit is placed between the phase comparator and the oscillation circuit. In addition, the PLL circuit is also provided with a digital-value setting section configured to set a digital value in the variation range of the output by the phase comparator and a second variable-gain circuit having a gain equal to the gain of the first variable-gain circuit. In this configuration, a set digital value is converted by the second variable-gain circuit into a subtrahend to be subtracted from a digital value representing a dividing ratio. A difference representing the result of the subtraction is added to a value output by the first variable-gain circuit and the sum obtained as a result of the addition is used in execution of the digital control on the oscillation circuit.

That is to say, in the configuration of the PLL circuit provided by the embodiment of the present invention, the first variable-gain circuit placed between the phase comparator and the oscillation circuit adjusts the loop gain. At that time, a digital value computed from the dividing ratio and the set digital value is added to control data by the oscillation circuit so that the signal output by the phase comparator is converged to a value in the variation range. Thus, the loop gain can be increased without raising the number of bits composing a digital value representing the output by the phase comparator. In addition, since the output by the phase comparator can be converged to a set value in the variation range, it is possible to enhance the stability.

In addition, it is also possible to provide the PLL circuit according to the embodiment of the present invention with a configuration in which a digital low-pass filter is connected at a stage following the phase comparator. The digital low-pass filter can impose band restrictions on noise components caused by phase and quantization errors included in the output by the phase comparator and, hence, reducing the effect of the noises outside the pass band on the output by the oscillation circuit.

On top of that, it is also possible to provide the PLL circuit according to the embodiment of the present invention with a configuration in which there is further included a convergence detection circuit for detecting the degree of convergence of an output by the phase comparator, and the gains of the first and second variable-gain circuits are changed in accordance with a detection result produced by the convergence detection circuit as a result indicating the degree of convergence of an output by the phase comparator. The noise reduction and response on convergence are in a relation of trade-off relating to the gain of the open loop. It is desired to set the gain at a large value for reducing noises but, gain reduction is needed for high-speed convergence. By using a detection result produced by the convergence detection circuit, while the transition to the state of convergence is taking place, the gain of the open loop is set at a small value in order to raise the speed of the transition. As a sufficiently high degree of convergence is detected, the gains of the first and second variable-gain circuits are changed in order to set the gain of the open loop at a large value so as to reduce noises. In addition, by providing a digital low-pass filter at a stage following the phase comparator also in this case, the digital low-pass filter can impose band restrictions on noise components caused by phase and quantization errors included in the output by the phase comparator and, hence, reducing the effect of the noises outside the pass band on the output by the oscillation circuit.

By applying the PLL circuit according to the embodiment of the present invention, it is possible to construct a radio communication apparatus having low phase noises and capable of achieving a locked state in a short period of time.

In accordance with the embodiments of the present invention, it is possible to provide a PLL circuit capable of executing excellent digital control and stabilizing a loop without substantially increasing the number of bits output by a phase comparator.

In addition, since the PLL circuit provided by the embodiments of the present invention can converge the output by the phase comparator to a desired set value, the PLL circuit is capable stabilizing its loop.

On top of that, by employing a digital filter for setting an optimum loop band, the PLL circuit provided by the embodiments of the present invention is capable of reducing effects of a phase error generated by the phase comparator.

Furthermore, since the PLL circuit provided by the embodiments of the present invention can change the loop gain in accordance with the degree of convergence of the loop, the PLL circuit can achieve a locked state in a short period of time. By employing a digital filter for setting an optimum loop band also in this case, the PLL circuit can reduce effects of a phase error generated by the phase comparator.

Moreover, by using the PLL circuit according to the embodiments of the present invention, it is possible to construct a radio communication apparatus having low phase noise and capable of achieving a locked state in a short period of time.

These and other features and merits of the present invention will become clear from the following description of preferred embodiments given with reference to accompanying diagrams.

DETAILED DESCRIPTION OF THE PREFERRED EMBODIMENTS

Hereinafter, the preferred embodiments of the present invention will be described with reference to accompanying drawings.

Figure 1:
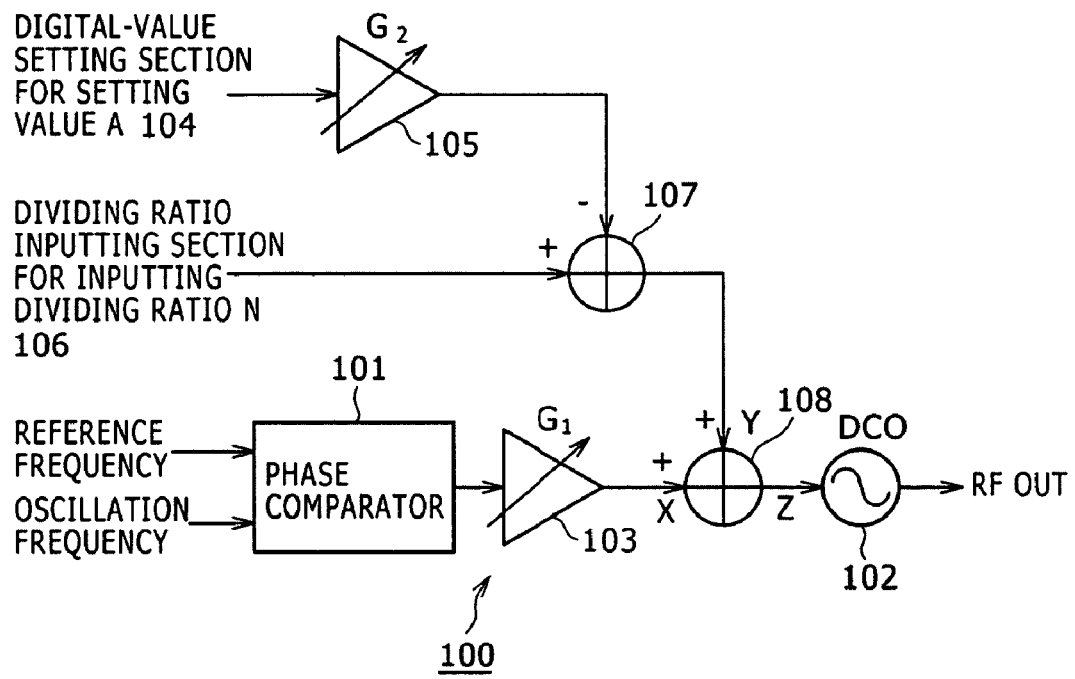
FIG. 1 is a diagram showing the configuration of a digital PLL circuit 100 according to an embodiment of the present invention.

FIG. 1 is a diagram showing the configuration of a digital PLL circuit 100 according to an embodiment of the present invention. The basic configuration of the digital PLL circuit 100 includes a DCO (Digitally Controlled Oscillator) 102, a phase comparator 101 and a first variable-gain circuit 103. The DCO 102 controls its oscillation frequency in accordance with an input digital value. The phase comparator 101 carries out a phase comparison process of comparing the oscillation frequency of the DCO 102 with the frequency of a reference signal. The first variable-gain circuit 103 amplifies the output by the phase comparator 101.

When the phase comparator 101 compares the phase of the reference signal with the phase of an oscillation signal RF OUT generated by the DCO 102, in each period of the reference signal, the phase comparator 101 performs a subtraction process of finding a difference between a dividing ratio represented by a digital signal and a digital value representing each cumulative addition value of a clock count expressed in a decimal-point format representing the oscillation frequency. An output by the phase comparator 101 is amplified through the first variable-gain circuit 103 and fed back to the DCO 102 as a control voltage signal for controlling the oscillation frequency from the DCO 102. In such a feedback loop, in every period of the reference signal, the clock count representing the oscillation frequency from the DCO 102 is converged to an equivalent for the dividing ratio. That is to say, the DCO 102 outputs a frequency equal to a product obtained as a result of multiplying the frequency of the reference signal by the dividing ratio.

As shown in the figure, the input terminal of the DCO 102 is connected to the output terminal of the phase comparator 101 through the first variable-gain circuit 103. In a phase comparison process carried out by the phase comparator 101 employed in the digital PLL circuit 100, in each period of a reference signal, it is performed a subtraction process of finding a difference between a digital value obtained by converting the dividing ratio and a digital value representing each cumulative addition value of a clock count expressed in a decimal-point format representing the oscillation frequency. For this reason, the variation range is limited by the number of bits output by the phase comparator 101 as described earlier. If the output of the phase comparator 101 is an unsigned signal consisting of 10 bits excluding a sign bit, the output has 1024 patterns from 0 to 1,023. Thus, in order to assure the stability of the loop, it is desired to actively converge the output by the phase comparator 101 to the neighborhood of 512 as the center of the variation range.

By setting the gain $G_1$ of the first variable-gain circuit 103 at a smaller value, a gain from the input of the DCO 102 to the output of the phase comparator 101 can be increased. That is to say, the first variable-gain circuit 103 generates the variable gain $G_1$ cancelling the gain from the input of the DCO 102 to the output of the phase comparator 101, thereby functioning as a negative-feedback loop by setting the gain of the closed loop at 1. In addition, by setting the gain $G_1$ of the first variable-gain circuit 103 at a smaller value, the gain of the open loop itself can be increased so that it is possible to implement a negative-feedback loop with a small error.

In addition, the first variable-gain circuit 103 works in a direction to attenuate a phase error caused by a quantization error appearing in the output of the phase comparator 101 as an error inherent in a digital system. Thus, the first variable-gain circuit 103 also contributes to reduction of phase noises.

Since the DCO 102 is controlled by making use of a dividing ratio expressed by a digital value obtained by dividing the oscillation frequency by the reference frequency, on the other hand, the output by the phase comparator 101 has a value equal to a product obtained by multiplying the dividing ratio by the gain of the open loop. Thus, if the gain of the open loop is increased in order to construct a negative-feedback loop with a small error, the output by the phase comparator 101 will have an extremely large value. That is to say, in order to obtain a sufficient variation range of the output by the phase comparator 101, it inevitably increases the number of bits composing the digital value of the output by the phase comparator 101.

In order to solve the above problem, the digital PLL circuit 100 shown in the diagram of FIG. 1 is provided with a mechanism for converging the output by the phase comparator 101 to a desired target value so that it is possible to keep the number of bits output by the phase comparator 101 at a small value while reducing the phase error by increasing the gain of the open loop. To put it concretely, the digital PLL circuit 100 also employs a digital-value setting section 104, a second variable-gain circuit 105, a dividing-ratio inputting section 106, a first adder 107 and a second adder 108. The digital-value setting section 104 sets a digital value in the variation range of the output by the phase comparator 101 at a value A. The dividing-ratio inputting section 106 inputs a dividing ratio N. The second variable-gain circuit 105 having a gain $G_2$ equal to the gain $G_1$ of the first variable-gain circuit 103 converts the set value A into a subtrahend to be subtracted from the dividing ratio N. The first adder 107 subtracts the subtrahend from the dividing ratio N. The second adder 108 adds the output of the first adder 107 to the output of the first variable-gain circuit 103.

It is assumed that the output of the first variable-gain circuit 103 is represented as "X," the output of the first adder 107 as "Y," and the output of the second adder 108 as "Z." The operation at the second adder 108 is given as following Eq. (1).

$$X+Y=Z \quad (1)$$

For example, the carrier frequency is 3.4 GHz and the reference frequency is 50 MHz. In this case, the value N of the dividing ratio Z is 68.

Here, the set value A is first amplified by the second variable-gain circuit 105 and then subtracted from the dividing ratio N at the first adder 107, thereby the operation is given as following Eq. (2).

$$Y=N-A\cdot G_2 \quad (2)$$

In addition, the output Z of the second adder 108 is converged to the dividing ratio N (that is, Z=N) and the variable gain circuit $G_1$ of the first variable-gain circuit 103 is equal to the variable gain $G_2$ of the second variable-gain circuit 105 (that is, $G_1=G_2$), thereby the operation can be transformed into Eq. (3) given as follows.

$$X=Z-Y=N-(N-A\cdot G_2)=A\cdot G_2=A\cdot G_1 \quad (3)$$

As is obvious from Eq. (3) given above, the output by the phase comparator 101 can be actively converged to the set value A.

If the integer part of the signal output by the phase comparator 101 is expressed as an unsigned digital value consisting of 10 bits excluding the sign bit, that is, a digital value in the range 0 to 1,023 for example, the variation range of the integer part of the signal output by the phase comparator 101 is 0 to 1,023. Typically, the digital-value setting section 104 sets the value A at 512 as the center of the variation range. In this case, since the phase comparator 101 operates at about the center of the variation range, a stable operation can be carried out.

In addition, the first variable-gain circuit 103 has the gain G1 for canceling the gain of the open loop. Thus, even if the gain of the open loop is set at a large value, the number of bits output by the second adder 108 placed at a stage behind the first variable-gain circuit 103 does not have to be increased to a value greater than the number of bits output by the phase comparator 101.

Figure 2:
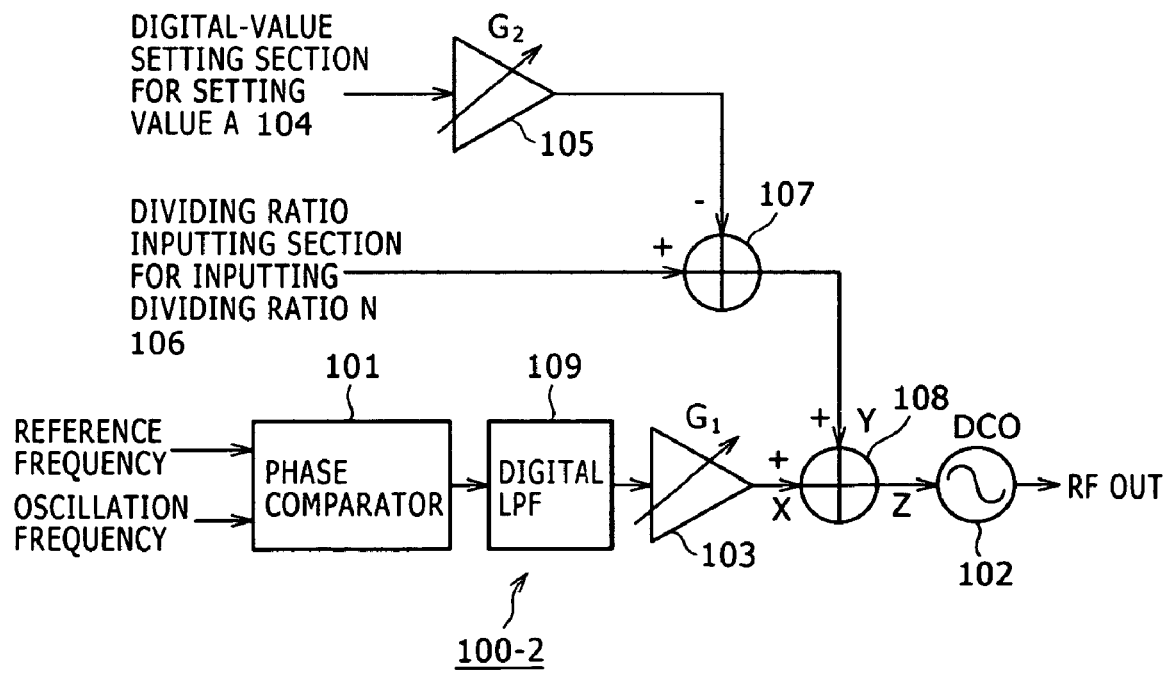
FIG. 2 is a diagram showing the configuration of a digital PLL circuit 100-2 according to another embodiment of the present invention.

FIG. 2 is a diagram showing the configuration of a digital PLL circuit 100-2 according to another embodiment of the present invention. In addition to the components included in the configuration of the digital PLL circuit 100 shown in FIG. 1, the digital PLL circuit 100-2 also employs a low-pass filter 109 provided between the phase comparator 101 and the first variable-gain circuit 103. The configuration enables to impose band restrictions on noise components caused by phase and quantization errors included in the output by the phase comparator 101 and, hence, reduce the effect of the noises outside the pass band on the output by the DCO 102. In addition, since the low-pass filter 109 is a digital filter, the cutoff frequency can be changed relatively with ease. Thus, the configuration can be regarded as a reconfigurable RF configuration that can be shared by a plurality of radio systems.

Figure 3:
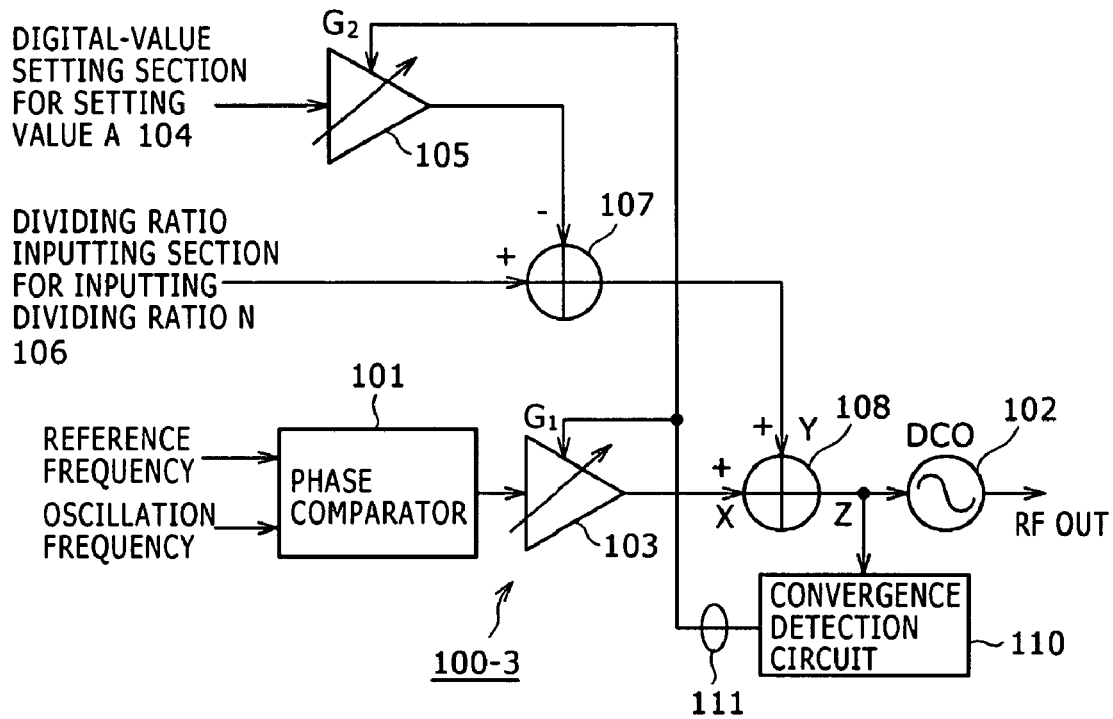
FIG. 3 is a diagram showing the configuration of a digital PLL circuit 100-3 according to a further embodiment of the present invention.

FIG. 3 shows the configuration of a digital PLL circuit 100-3 according to a further embodiment of the present invention. In addition to the components included in the configuration of the digital PLL circuit 100 shown in the diagram of FIG. 1, the digital PLL circuit 100-3 also employs a convergence detection circuit 110 which detects the degree of convergence of the output by the phase comparator 101. In accordance with the degree of convergence, the convergence detection circuit 110 changes the gains of the first variable-gain circuit 103 and the second variable-gain circuit 105 by supplying a gain changing signal 111.

The noise reduction and response on convergence are in a relation of trade-off relating to the gain of the open loop. It is desired to set the gain at a large value for reducing noises but, gain reduction is needed for high-speed convergence, as described hereinbefore. Therefore, in the configuration shown in FIG. 3, the open loop can be changed in accordance with the degree of convergence.

From an initial stage to a stage in which the output by the phase comparator 101 is converged to a certain degree, the gain of the open loop is set at a relatively small value by increasing the gain $G_1$ of the first variable-gain circuit 103 and the gain $G_2$ (=$G_1$) of the second variable-gain circuit 105. Thereafter, as a process to attain the state of convergence is carried forward and the convergence detection circuit 110 detects a sufficiently high degree of convergence later on, the convergence detection circuit 110 outputs the gain changing signal 111 to the first variable-gain circuit 103 and the second variable-gain circuit 105 as a command to decrease the gain G1 of and the gain G2 in order to change the gain of the open loop to a larger value. In this way, it is possible to implement low phase noises and high-speed convergence.

In this case, since the gain $G_1$ of the first variable-gain circuit 103 and the gain $G_2$ of the second variable-gain circuit 105 are always made equal to each other, Eq. (3) given before holds true. Thus, it is possible to implement a stable convergence process without discontinuities generated in digital values output by the phase comparator 101 and the input to the DCO 102 even at the time each of the gain G1 and the gain G2 are changed to another value.

Figure 4:
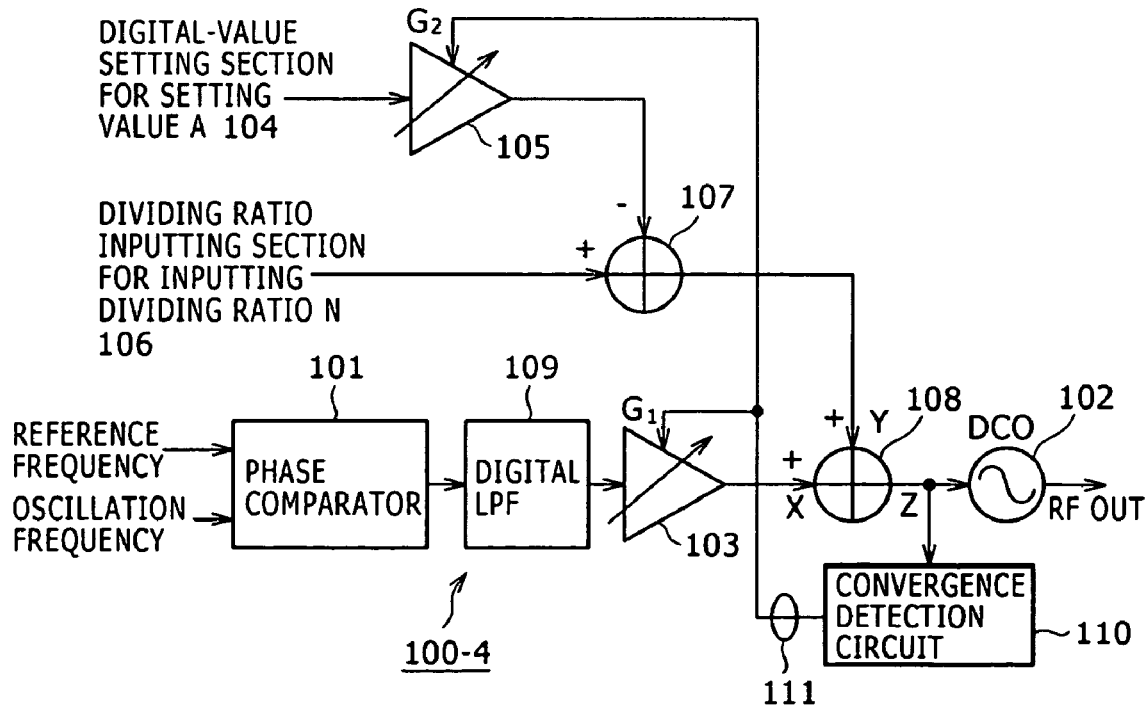
FIG. 4 is a diagram showing the configuration of a digital PLL circuit 100-4 according to a still further embodiment of the present invention.

FIG. 4 shows the configuration of a digital PLL circuit 100-4 according to a still further embodiment of the present invention. In addition to the components included in the configuration of the digital PLL circuit 100-3 shown in FIG. 3, the digital PLL circuit 100-4 also employs a low-pass filter 109 provided between the phase comparator 101 and the first variable-gain circuit 103. The digital low-pass filter 109 can impose band restrictions on noise components caused by phase and quantization errors included in the signal output by the phase comparator 101 and, hence, reduce the effect of the noises outside the pass band on the signal output by the DCO 102. In addition, since the low-pass filter 109 is a digital filter, the cutoff frequency can be changed relatively with ease. Thus, the configuration of the digital PLL circuit 100-4 can be regarded as a reconfigurable RF configuration that can be shared by a plurality of radio systems.

Figure 5:
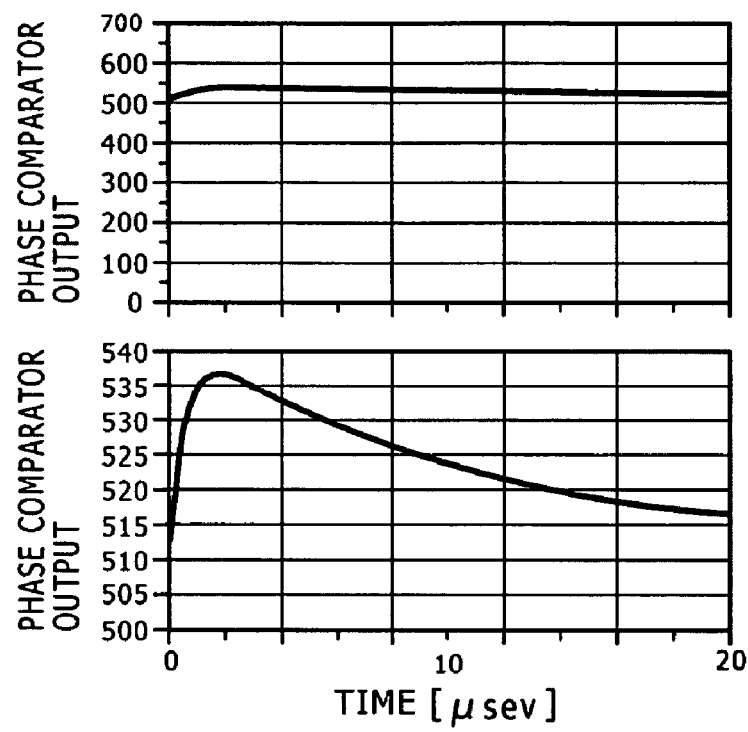
FIG. 5 is a diagram showing a simulation result regarding the output by a phase comparator for a case in which a variable gain $G_1$ ($=G_2$) is set at a fixed value of $1/2^9$ in the digital PLL circuit 100-4 shown in FIG. 4.

FIG. 5 shows a simulation result regarding the degree of convergence of a signal output by the phase comparator 101 for a case in which each of the variable gain $G_1$ and the variable gain $G_2$ (=$G_1$) is set at a fixed value of $\frac{1}{2}^9$. Each graph shown in FIG. 5 is drawn by taking the horizontal axis as an axis representing the lapse of time and the vertical axis as an axis representing the digital value output by the phase comparator 101. The lower graph is a graph obtained as a result of enlarging the scale of the vertical axis for digital values output by the phase comparator 101 as values in the range 500 to 540.

Figure 6:
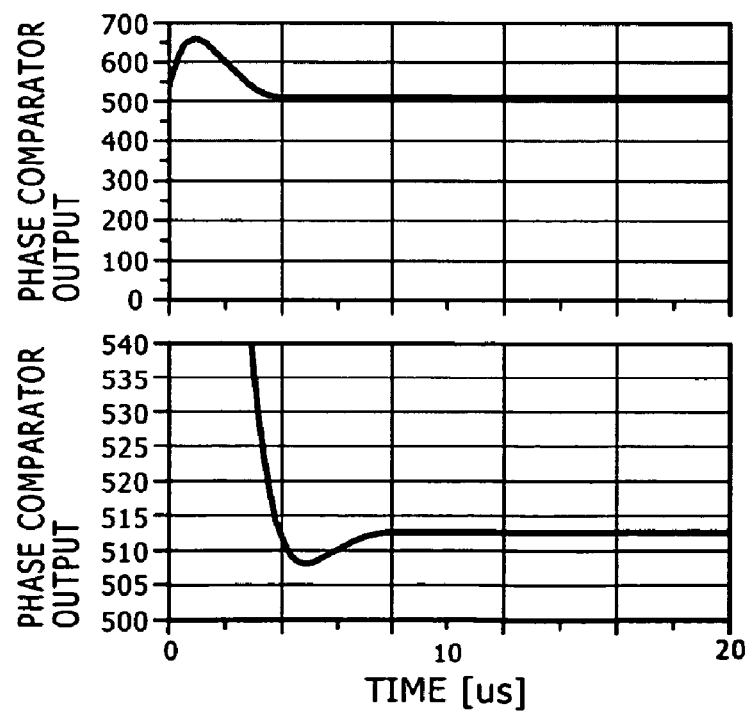
FIG. 6 is a diagram showing a simulation result regarding the output by the phase comparator for a case in which in accordance with the degree of convergence output by the phase comparator, the variable gain $G_1$ ($=G_2$) is changed from $1/2^6$ to $1/2^9$ in the digital PLL circuit 100-4 shown in FIG. 4.
Figure 7:
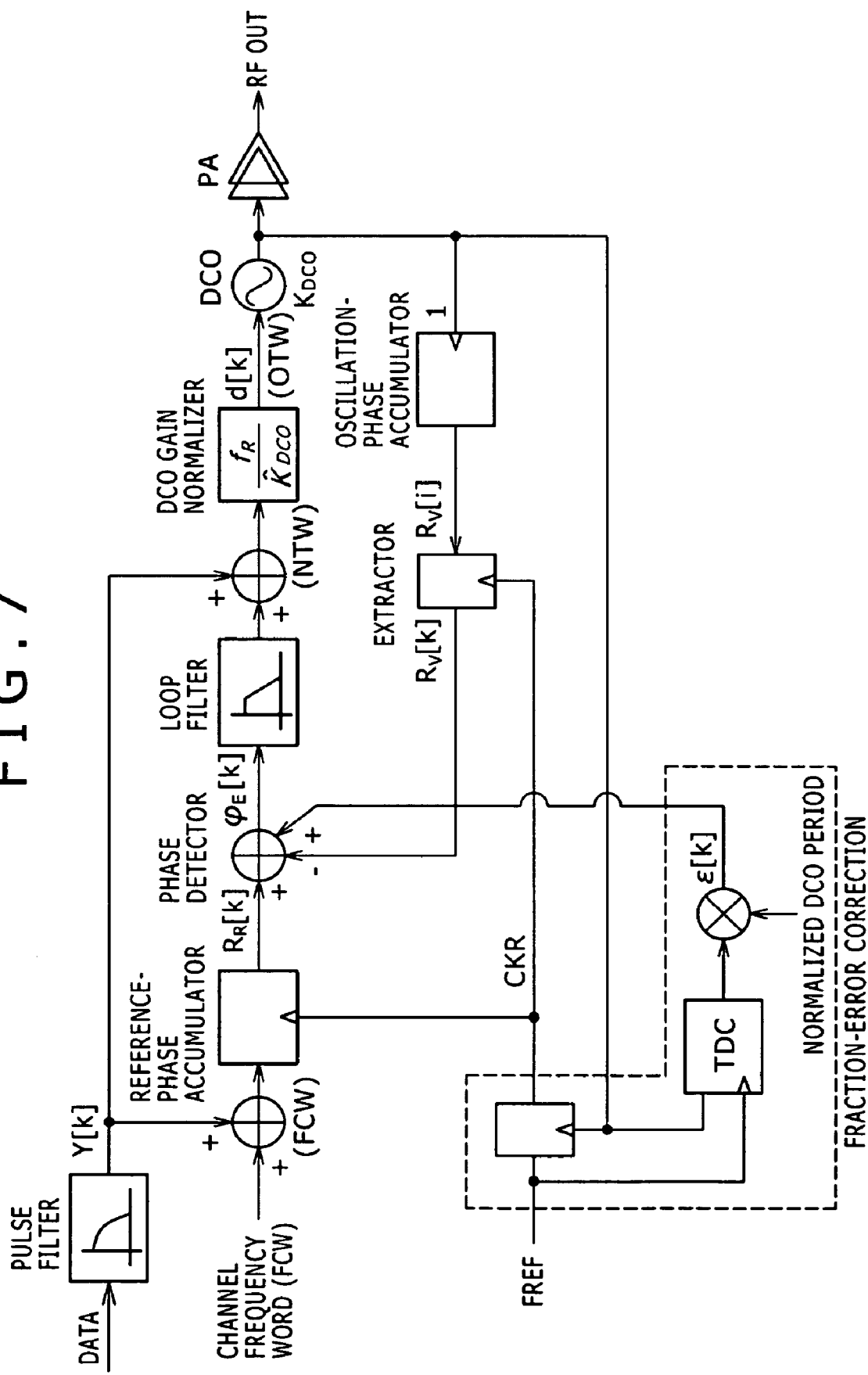
FIG. 7 is a diagram showing a typical configuration of an all-digital PLL circuit employing a DCO.
Figure 8:
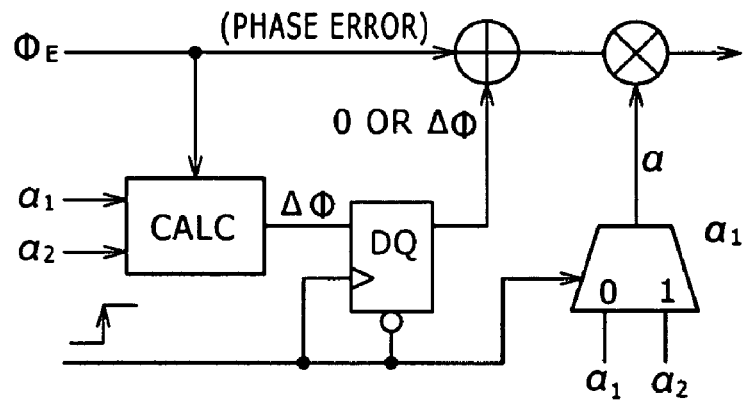
FIG. 8 is an explanatory diagram to be referred to in description of a method for changing a loop gain in a digital PLL circuit.

FIG. 6 shows a simulation result regarding the output by the phase comparator 101 for a case in which each of the variable gain $G_1$ and the variable gain $G_2$ (=$G_1$) is changed from $\frac{1}{2}^6$ to $\frac{1}{2}^9$ in accordance with the degree of convergence of the output by the phase comparator 101. Each graph shown in the diagram of FIG. 6 is drawn by taking the horizontal axis representing the lapse of time and the vertical axis representing the digital value output by the phase comparator 101. The lower graph is a graph obtained as a result of enlarging the scale of the vertical axis for digital values output by the phase comparator 101 as values in the range 500 to 540.

By comparing the simulation results shown in FIG. 5 and FIG. 6, it becomes obvious that, by changing the variable gains $G_1$ and $G_2$ (=$G_1$) from $\frac{1}{2}^6$ to $\frac{1}{2}^9$ in accordance with the convergence degree of the output by the phase comparator 101, the output can be converged sufficiently within a time period of 10 micro seconds. Thus, the speed of the response of the phase comparator 101 can be increased.

Figure 9:
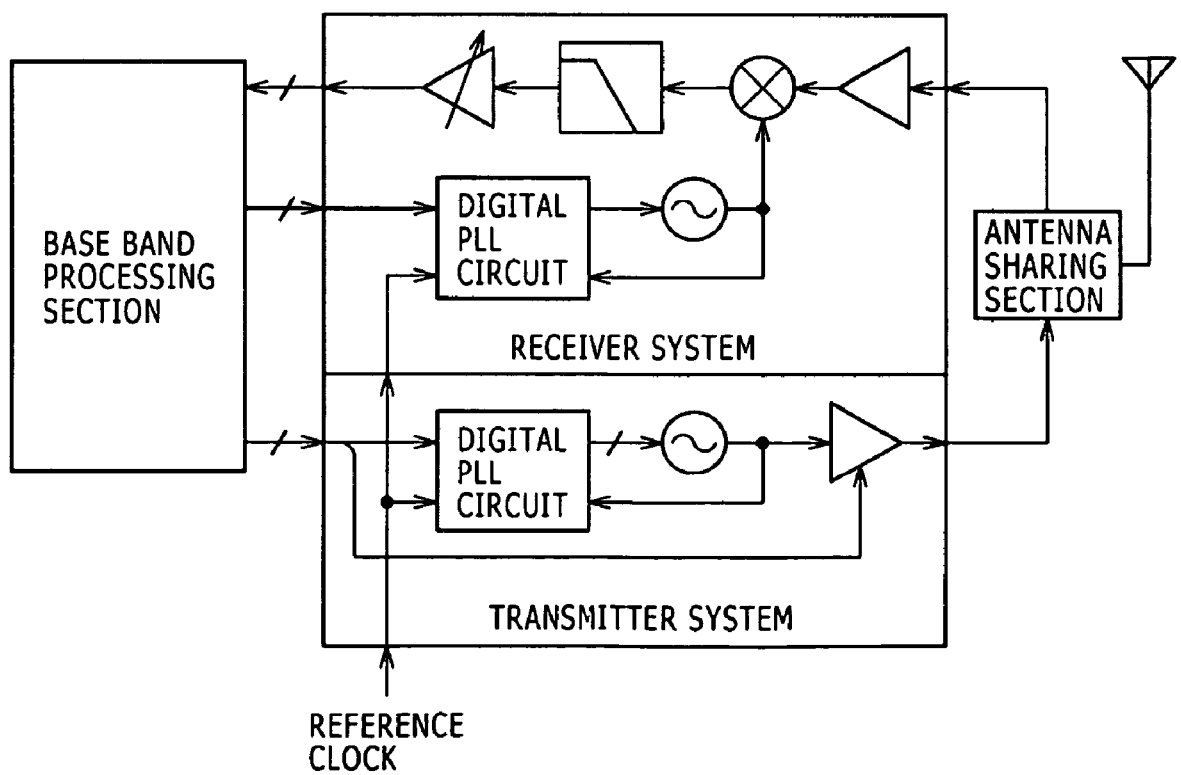
FIG. 9 is a diagram showing a typical configuration of a radio communication apparatus to which any one of the digital PLL circuits provided by the present invention can be applied.

The description given so far has explained a PLL circuit capable of stabilizing its loop without substantially increasing the number of bits output by a phase comparator employed therein. By using the digital PLL circuit shown in any of the diagrams of FIGS. 1 to 4, it is possible to construct a radio communication apparatus that has low phase noises and is capable of achieving a locked state in a short period of time. FIG. 9 shows a typical configuration of a radio communication apparatus to which any one of these digital PLL circuits can be applied.

The present invention has been described in detail so far by explaining the preferred embodiments. However, it is obvious that each of the preferred embodiments can be modified to a version or replaced by a substitute as far as each of the version and the substitute is in a range not deviating from the gist of the present invention.

Moreover, by using the digital PLL circuit according to the present invention, it is possible to construct a radio communication apparatus that has low phase noises and is capable of achieving a locked state in a short period of time.

This patent specification has explained a typical case in which a digital PLL circuit is applied to a radio communication apparatus as a circuit for putting the frequency and phase of a carrier frequency in a locked state. However, the gist of the present invention are by no means limited to this special case. Even though most digital PLL circuits are each used the output thereof as a clock signal, the circuits can also be used in applications other than the radio communication apparatus. An example of the applications is for reproducing a clock signal to be propagated through a digital interface conforming to either of the IEEE1394 standard, the HDMI (High Definition Multimedia Interface) and the like which are used in electronic equipment such as a digital TV and an AV amplifier.

In a word, the present invention has been exemplified in this patent specification by explaining the preferred embodiments each serving as a typical implementation and, thus, the contents of the specification are not to be interpreted as limitations of the present invention. In order to determine the gist of the present invention, the range of each claim should be referred to.

What is claimed is:

1. A phase lock loop (PLL) circuit capable of executing digital control of an oscillation circuit thereof by using a dividing ratio represented by a digital value obtained by dividing an oscillation frequency by a reference frequency, the PLL circuit comprising:
 a phase comparator for comparing the digital value obtained by converting the dividing ratio with a digital value representing each cumulative addition value of a clock count expressed in a decimal-point format representing the oscillation signal in each period of a reference signal;

loop-gain control means for controlling the loop gain of the PLL circuit; and output converging means for converging an output by the phase comparator.

2. The PLL circuit according to claim 1, wherein the loop-gain control means is a first variable-gain amplification circuit provided between the phase comparator and the oscillation circuit;

the output converging means includes digital-value setting means for setting a digital value in the variation range of the output by the phase comparator; and a second variable-gain circuit having a variable gain equal to the variable-gain of the first variable-gain circuit, the second variable-gain circuit converting the set digital value into a subtrahend to be subtracted from a digital value representing the dividing ratio for producing a difference to be added to a value output by the first variable-gain circuit in order to produce a sum for controlling the oscillation circuit.

3. The PLL circuit according to claim 1, wherein a digital low-pass filter is provided at a stage following the phase comparator.

4. The PLL circuit according to claim 1, further comprising a convergence detection circuit configured to detect the degree of convergence of the output by the phase comparator, wherein each of the gain of the first variable-gain circuit and the gain of the second variable-gain circuit is changed in accordance with a detection result produced by the convergence detection circuit as a result indicating the degree of convergence of the output by the phase comparator.

5. The PLL circuit according to claim 4, wherein from an initial stage to a stage in which the output by the phase comparator is converged to a certain degree as indicated by a detection result produced by the convergence detection circuit, each of the gain of the first variable-gain circuit and the gain of the second variable-gain circuit is set at a large value but, in accordance with the detection of sufficient convergence of the output by the phase comparator, each of the gain of the first variable-gain circuit and the gain of the second variable-gain circuit is changed to a small value.

6. The PLL circuit according to claim 5, wherein a digital low-pass filter is provided at a stage following the phase comparator.

7. A radio communication apparatus including a phase lock loop circuit according to claim 1.

8. A phase adjustment method for executing digital control of an oscillation circuit by using of a dividing ratio represented by a digital value obtained by dividing the oscillation frequency by a reference frequency, the phase adjustment method comprising:

a phase comparison step of comparing the digital value obtained by converting the dividing ratio with a digital value representing each cumulative addition value of a clock count expressed in a decimal-point format representing an oscillation signal in each period of a reference signal;

a first variable-gain amplification step of converting an output at the phase comparison step;

a digital-value setting step of setting a digital value in the variation range of the output at the phase comparison step;

a second variable-gain amplification step of converting the digital value set by using a gain equal to the gain of the first variable-gain amplification step; and a step of subtracting the converted digital value from the digital value representing the dividing ratio and adding the resultant to a value output at the first variable-gain amplification step in order to produce a sum for controlling the oscillation circuit.

* * * * *